United States Patent
Schrott et al.

[19]

[11] Patent Number: 5,821,859
[45] Date of Patent: *Oct. 13, 1998

[54] CONCEALED MAGNETIC ID CODE AND ANTITHEFT TAG

[75] Inventors: Alejandro Gabriel Schrott, New York; Richard Joseph Gambino, Stony Brook; Robert Jacob von Gutfeld, New York, all of N.Y.

[73] Assignee: IBM Corporation, Armonk, N.Y.

[*] Notice: The term of this patent shall not extend beyond the expiration date of Pat. No. 5,736,929.

[21] Appl. No.: 660,249

[22] Filed: Jun. 7, 1996

[51] Int. Cl.⁶ .................................................. G08B 13/187
[52] U.S. Cl. ......................... 340/572; 340/551; 340/572; 235/493
[58] Field of Search ................................... 340/551, 572, 340/825.34, 825.54; 235/493

[56] References Cited

U.S. PATENT DOCUMENTS

| | | | |
|---|---|---|---|
| 4,652,863 | 3/1987 | Hultman | 340/551 |
| 4,940,966 | 7/1990 | Pettigrew et al. | 340/551 |
| 5,420,569 | 5/1995 | Dames et al. | 340/551 |
| 5,528,222 | 6/1996 | Moskowitz | 340/572 |
| 5,729,201 | 3/1998 | Jahnes et al. | 340/572 |
| 5,736,929 | 4/1998 | Schrott et al. | 340/572 |

OTHER PUBLICATIONS

K. Kawashima, et al "Mechanism of Matteucci Effect Using Amorphous Magnetic Wires", IEEE Translation Journal on Magnetics in Japan, vol. 8, No. 5, May 1993, pp. 318–325.

*Primary Examiner*—Daniel J. Wu
*Attorney, Agent, or Firm*—Stephen S. Strunck

[57] ABSTRACT

The invention relates to a special type of magnetic tag that serves both as an identifier of the article to which it is attached and as an antitheft device. The former attribute is especially important should stolen property be recovered. Identification comes about through the use of an array of individual magnetic elements that are closely spaced, preferably along and perpendicular to an amorphous wire or strip. The magnetic elements can take the form of magnetic ink, high coercivity wire, thin foil, or amorphous wire. The array may be personalized (coded) by leaving out elements of the array or driving selected elements to saturation while others remain demagnetized. The elements can also be in the form of a double array to constitute '1's and '0's to form a code. Reading of the elements is accomplished with a special reading head consisting or one or more small magnetic circuits coupled to one or more pickup loops. A longer length of soft magnetic wire or thin strip is used to trigger an anti-theft alarm when activated by an external field from a magnetic gate.

15 Claims, 13 Drawing Sheets

FIG. 8B  BIT = 1

FIG. 8C  BIT = 0

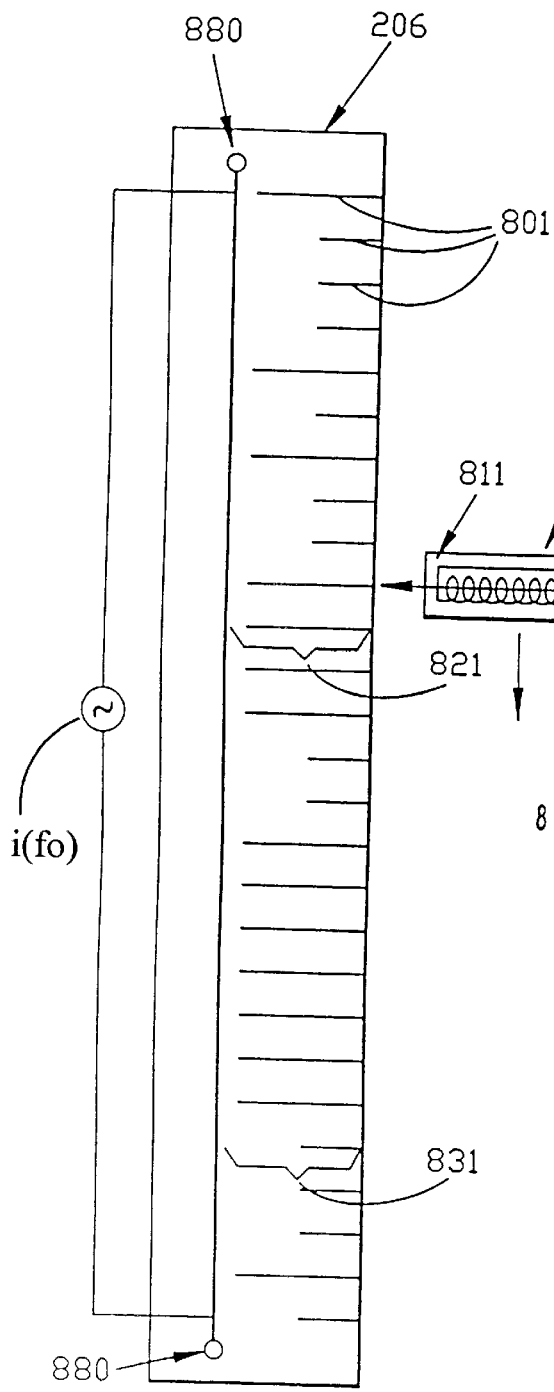
FIG. 9A
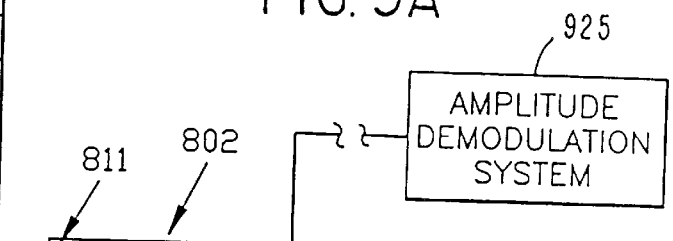
FIG. 9B
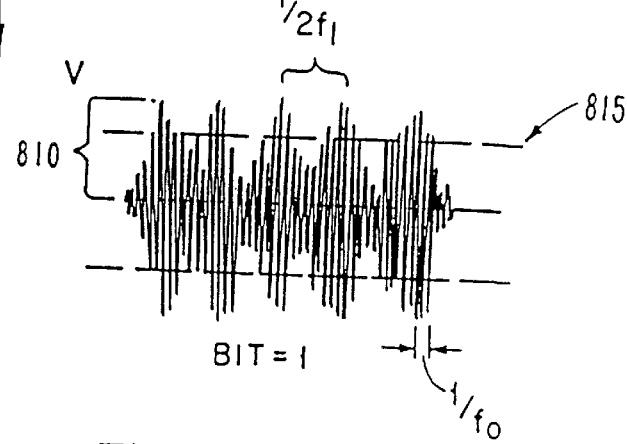
FIG. 9C
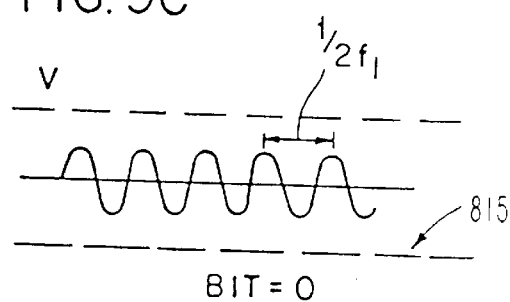

CONCEALED MAGNETIC ID CODE AND ANTITHEFT TAG

BACKGROUND OF THE INVENTION

The present invention generally relates to identification tags or markers for attachment to an article of interest, and more particularly to a special type of magnetic tag that serves both as an identifier of the article to which it is attached and as an antitheft device.

The invention disclosed and claimed herein is related to the invention disclosed and claimed in copending application Ser. No. 08/660,261, now U.S. Pat. No. 5,736,929.

Systems are known for the prevention of theft of articles, e.g., books from libraries and products from stores, which generally comprise a marker element attached to the article and instruments adapted to sense a signal produced by the marker upon its passage through an interrogation zone. Typically the marker is a magnetic wire or strip and the interrogation zone is provided by transmitter antenna coils which generate an alternating magnetic interrogation field in the zone. The marker is driven into and out of saturation which disturbs the alternating magnetic interrogation field and produces alternating magnetic fields at frequencies which are harmonics of the alternating magnetic interrogation field. The harmonics are detected by receiver antenna coils, which are frequently housed in the same structure as the transmitter coils, which in turn are processed by electronic processing means to produce alarm signals.

On a more sophisticated level, for retail tagging, tagging used in the road/air-freight package industry, and pallet tagging in manufacturing processes, a tag (also known as an "identification tag", "marker" or "label") is useful for identifying a product or article in detail. Such tags include bar code labels and radio frequency tags based on silicon memory and logic circuits (also known as RFID tags). By providing the tag with a sufficient number of bits and interrogating the tag, the tag can provide information such as what the product is, when it was manufactured, its price, and whether the product has been properly passed through a check-out counter or kiosk. Tags can also be used to identify a variety of other animate and inanimate objects too numerous to mention. Identifying a product via an RFID tag may hasten a new type of checkout system for the retail industry giving rise to a so-called "no-wait checkout".

The present technology used for magnetic tags which are widely used for anti-theft purposes has several drawbacks when extended to multibit capabilities including that relatively large sized markers result. In addition, there are problems due to the method of the tag's operation which prevents them from being solidly embedded. An example of a large multibit marker is the tag of Pettigrew et al., 4,940,966. Pettigrew et al. describe a tag having a limited number of bits which includes a plurality of soft magnetic strips mounted on a substrate, biased by adjacent strips of hard magnetic material. Typical spacing between strips is on the order of one centimeter with some strip lengths greater than 4 cm. Here, each element or strip defining a bit must have dimensions that differ from one another in order to give them a distinct characteristic, here being a unique hysteresis curve.

The magnetic multibit tag described by Dames and Hyde (5,420,569) uses magneto-mechanical coupling to cause resonances characterized by planar dimensional changes and enhanced magnetization of the strip elements. This tag is both large and has the disadvantage that the strip needs to be free-standing in order to resonate and therefore cannot be embedded.

The systems described above all have the capability of being interrogated remotely. In addition, there are means for storing many bits of information per unit area using magnetic stripes on items like credit cards. However, this type of storage device requires either direct or very close proximity of the reading head to the object and can be easily tampered with by use of a hard magnet. Furthermore, magnetic stripes cannot serve as a remotely sensed antitheft device.

There is a widespread problem with theft in many industries, e.g., in the computer industry where there is theft of both computer parts and components and entire computers. The theft is difficult to detect and if recovered after the theft, the recovered items are difficult if not impossible to identify. Thus, what is needed in addition to an anti-theft device is a means to identify the owner along with important data such as the warranty date. It is therefore important to 1) provide a means for preventing theft by concealing a type of sensor that can sound an alarm to an externally located receiver and 2) provide a set of elements that yield a code upon local interrogation, the elements being concealed and personalized to permit identification of the object should it be stolen and recovered.

Heretofore, there was no system that uses only magnetic excitation to excite both an element that sounds an alarm in case of theft (when the item is passed through a special gate) and also uses magnetic signals to interrogate a separate set of magnetic elements that serves to identify the item to which these elements have been made an integral part. At the present time, the latter function of providing identification (ID) of the item has relied on silicon technology, typically a memory and logic chip attached to an antenna, while anti-theft detection has relied either on magnetic or RF techniques. RFID tags presently available are difficult to conceal, are easily shielded and are prone to tampering.

SUMMARY OF THE INVENTION

The invention relates to a special type of magnetic tag that serves both as an identifier of the article to which it is attached and as an antitheft device. The former attribute is especially important should stolen property be recovered. Identification comes about through the use of an array of individual magnetic elements that are closely spaced, preferably along an amorphous wire. The magnetic elements can take the form of magnetic ink, high coercivity wire, thin foil, or amorphous wire. The array may be personalized (coded) by leaving out elements of the array or driving selected elements to saturation while others remain demagnetized. The elements can also be in the form of a single or double array to constitute '1's and '0's to form a code. Reading of the elements is accomplished with a special reading head consisting of one or more small magnetic circuits coupled to one or more pickup loops. A longer length of soft magnetic wire or thin strip is used to trigger an anti-theft alarm when activated by an external field from a magnetic gate. In certain embodiments, the anti-theft element is an integral part of the code array. The integrated identification and alarm devices of the invention are capable of being concealed in the article to be protected and identified, but need not be concealed. Such articles in the computer industry include, for example, processor chips, boards, such as memory boards, and modules such as single in-line memory modules (SIMMS).

A variety of means for creating a magnetic code is described that enables a special reading element to interpret the encoded information for purposes of identifying the manufacturer, date of manufacture and the like. Special reading heads are described to obtain the magnetic information which are transformed by means of a computer to a data file. A major feature of the magnetic tags of the invention is that they may be concealed within an item such as a computer part. Tampering with the magnetic tag destroys the item to which it is attached. Various magnetic effects are described that make the magnetic elements function as a code including the use of magnetic domain reversal of soft magnetic materials to produce a pulse corresponding to an information bit as well as the Matteucci effect.

BRIEF DESCRIPTION OF THE DRAWINGS

The foregoing and other aspects and advantages of the invention will be better understood from the following detailed description of the invention with reference to the drawings, in which:

FIG. 8B is a schematic graph of the Matteucci voltage produced by a perpendicular field applied to a low reluctance path.

FIG. 8C is a schematic graph of the field of 8B applied to a high reluctance path.

FIG. 9A shows the configuration of the tag of FIG. 8 except that the signal sensed at the contact points is modulated.

FIG. 9B is a schematic graph of the modulated Matteucci voltage produced by a perpendicular field applied to a low reluctance path.

FIG. 9C is a schematic graph of the signal of 9B after demodulation.

DETAILED DESCRIPTION OF THE INVENTION

One aspect of the present invention comprises several means for creating a concealable magnetic code and magnetic antitheft sensor. Another aspect is related to special sensors or heads that can read the magnetic elements making up the code. In addition, the antitheft element in the tag can be formed from a soft magnetic material such as an amorphous wire or a thin strip of amorphous foil. An externally applied magnetic field causes a non-linear signal rich in harmonics to be emitted by the aforementioned antitheft magnetic element. Any one of the harmonics can be sensed, preferably by a coil attached to a filter circuit, the latter to eliminate unwanted frequencies. The sensing circuit is generally located near an entrance/exit doorway so that when the antitheft magnetic element is sensed, an alarm rings.

While the general objective of this invention is to utilize magnetic elements in novel configurations to provide both antitheft and identification codes of objects to which they are attached, the invention is more particularly described with respect to computers or computer parts, such as a SIMM, a computer board, a microprocessor chip, a removable logic chip or any other component that can be removed from any electronic device. More importantly, the tags of this invention can be embedded and concealed in parts and components, but need not be, and are thus especially useful with items that have monetary value and are subject to theft.

Figure 1A:
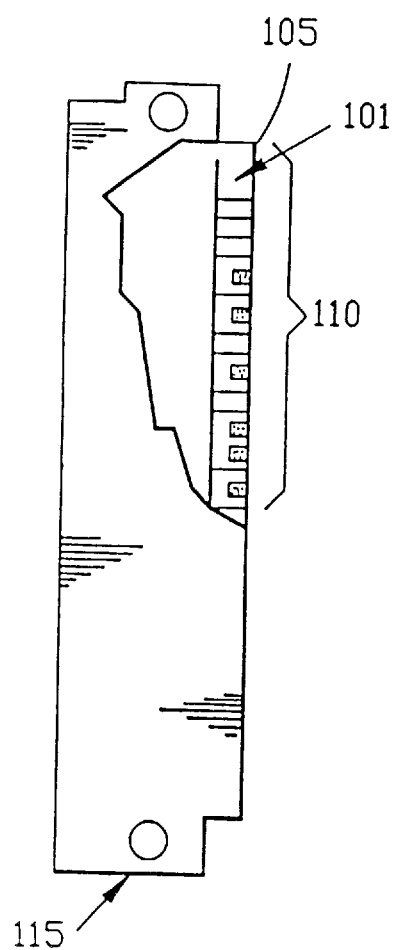
FIG. 1A shows a partial cutaway top view of a single in-line memory module (SIMM) having a tag of the invention concealed within the laminations of the SIMM circuit board.
Figure 1B:
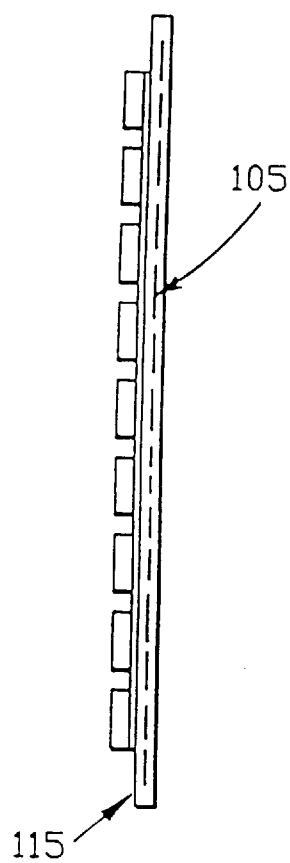
FIG. 1B is a side view of the SIMM of FIG. 1A.
Figure 2:
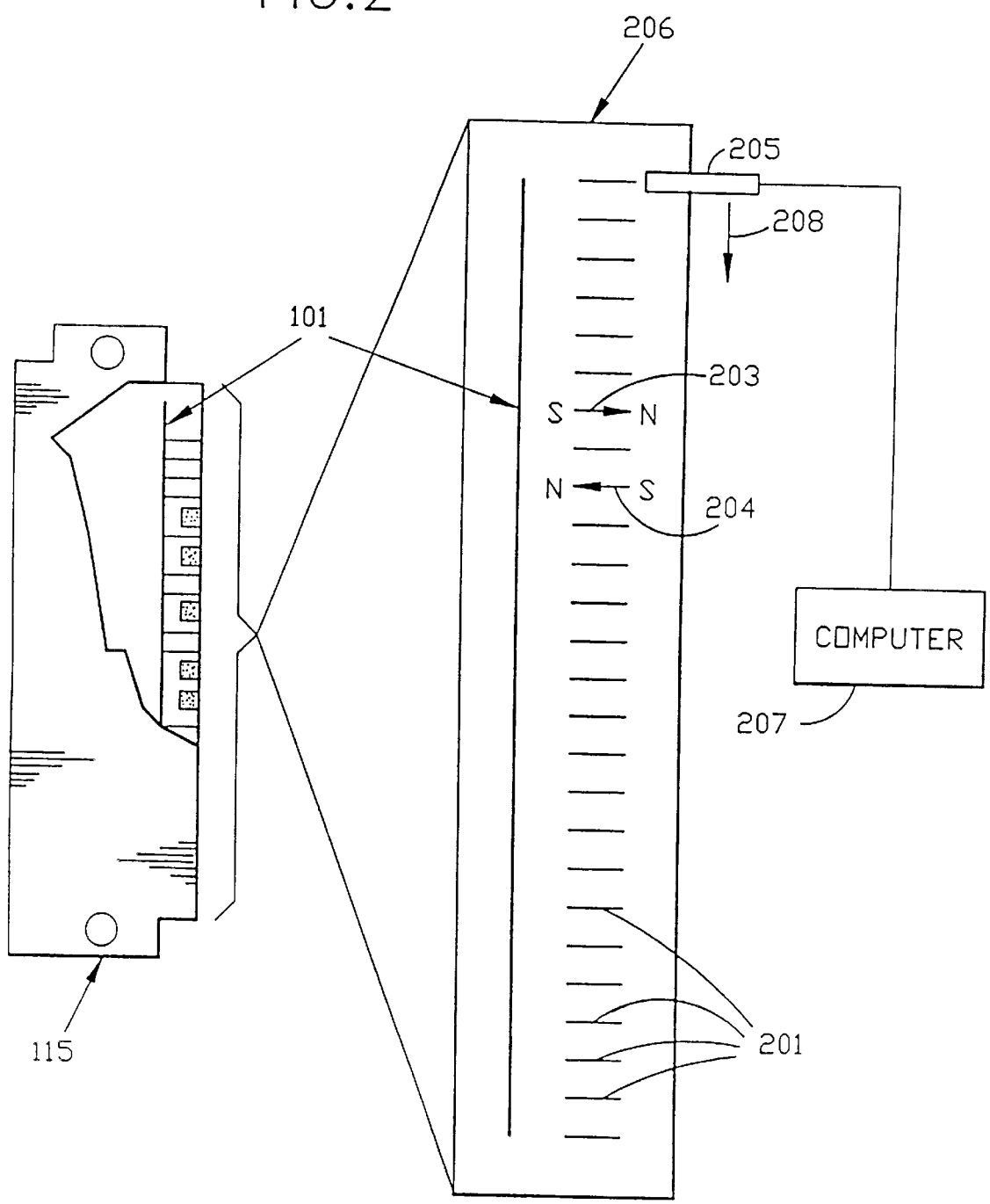
FIG. 2 shows the concealed tag of FIG. 1A having an array of polarized hard magnets and an antitheft wire. A read only head and schematics of the reading assembly are also shown.

To obtain data pertaining to an item, such as its identify and warranty data, this invention includes several embodiments in the form of a magnetic tag. In FIG. 1, one such tag 105 also includes an array 110 of magnetic elements which can be in the form of strips of foil, wire or magnetic ink deposited from an ink jet. All the aforementioned may be deposited in a prearranged array dictated by a computer program and computer control. As shown in FIG. 1, tag 105 includes a soft magnetic wire 101 which is used for antitheft control. In FIGS. 1A and 1B, tag 105 is shown embedded in the lamination of SIMM circuit board 115. FIG. 2 shows an embodiment using hard magnetic elements 201, which utilize the local magnetization of each element in its remanent state in one of two directions denoted by arrows 203 and 204 to represent a '1' or a '0'. Such a code can be read by moving a sensor or head 205 along a direction perpendicular to the magnetization but parallel to the plane of tag 206 as shown by arrow 208. A computer 207 is used to record the direction of magnetization of each element 201. These data are then interpreted and translated into the identification of the item to which the magnetic code is attached. Sensor 205 can consist of an interrogation coil and a sensing element (i.e., a magnetoresistive or inductive head commonly used in magnetic recording devices). Alternative methods for assigning '1's and '0's from the orientation of the local magnetization of magnetic elements in an array is known in the art.

With an appropriate magnetic head well known in the art, the magnetic elements 201 can also be reversed in their polarity by applying a locally intense field of a polarity opposite to that of the bit. Alternatively, the hard magnetic element or bit 201 can be locally demagnetized by a decrementing ac field to cause the magnetic element to register as a '0'.

One way of fabricating hard magnetic elements that resist tampering is to use a very high coercivity composition such as barium hexaferrite which requires switching fields in excess of 2 kilo Oersteds. Code is established by selecting certain elements to heat and the direction of the field to be applied during the heating/cooling cycle, thereby generating an array of '1's and '0's. In its completed state, each element has been heated and cooled, but with the direction of magnetization selected to be in one or the other direction. The resultant remanent state will be highly resistant to most fields that could be used to tamper with the stored code.

The magnetic elements comprising the magnetic code can be disposed on a thin flexible substrate which in turn can be laminated or buried under a concealed portion of, for example, a computer board, chip assembly or within a portion of the computer itself. The tag can be easily concealed in a microprocessor by affixing the tag to the microprocessor with an adhesive which is subsequently covered by a cap that forms a heat sink. Alternatively, the tag can be attached to the peripheral edges of the microprocessor which is then covered by a thin layer of hard epoxy. Removal of the epoxy or the heat sink cap destroys the chip. The depth to which the magnetic elements can be buried or concealed depends on the size of the elements and the particular dimensions of the sensing head. Typically, the spacing between the sensor head and the magnetic element has to be small compared to the dimension of the element.

Figure 3:
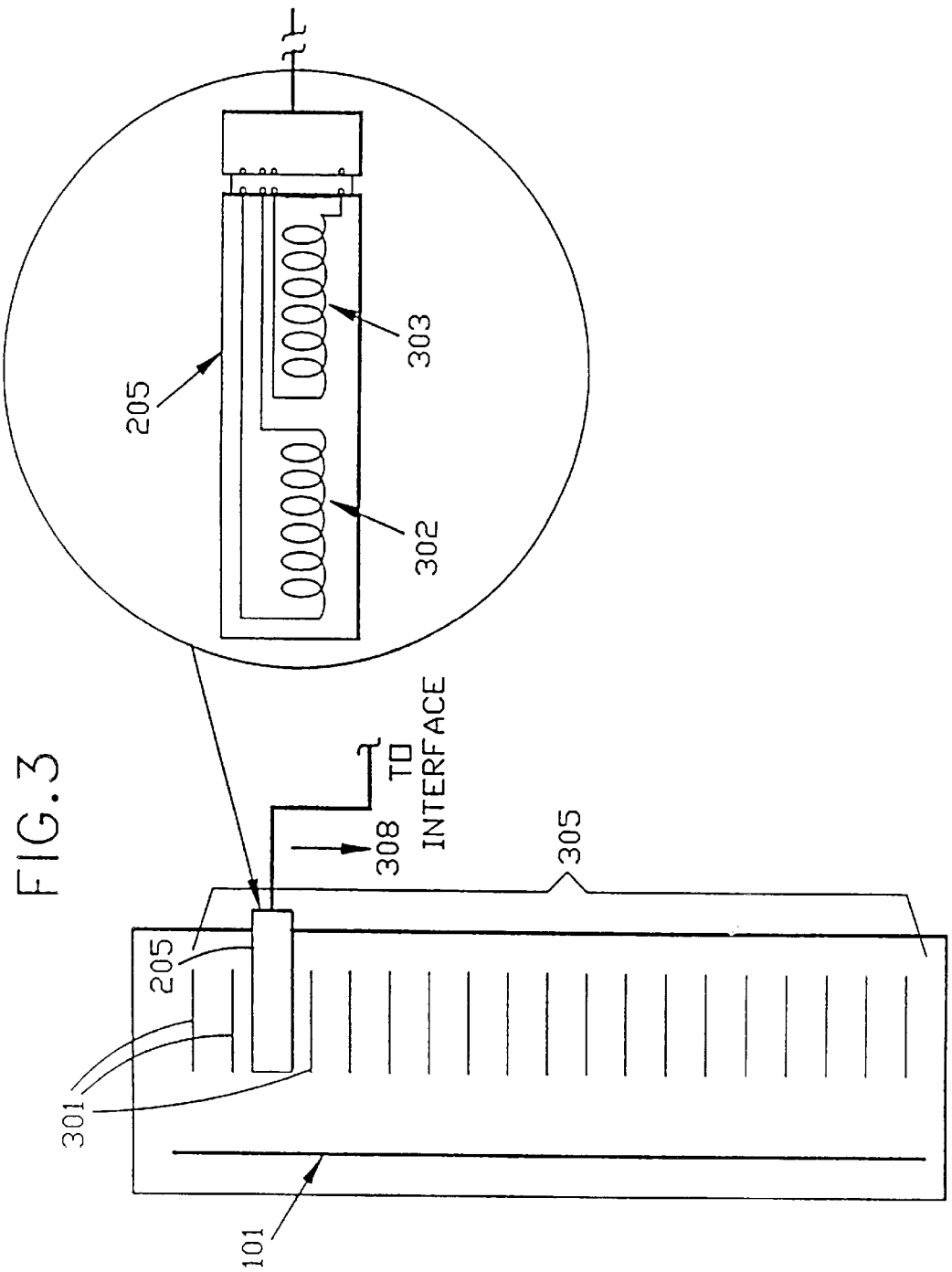
FIG. 3 shows the tag of FIG. 2 together with a more detailed schematic of the read/write sensing head.

In an alternative embodiment shown in FIG. 3, the code is not given by the remanent state of the magnetic element but rather by the local field produced by the presence of soft magnetic elements 301 when driven along their hysteresis curve by an applied local ac field of sufficient intensity. The information provided by array 305 can be read, for instance, by moving sensor head 205 along the row of elements 301 in the direction shown by arrow 308. Reading of the code is accomplished by means of a driving coil 302 and a receiving coil 303, both part of sensing head 205, as shown in FIG. 3.

Magnetic array 305 consists of individual magnetic wires or strips 301 of low remanent magnetic material that can be magnetized/demagnetized upon interrogation with appropriately sized sensor head 205. If an element in the array is physically present and in condition where it can be made to traverse a hysteresis loop using an applied magnetic field, the resulting magnetization can be sensed by coil 303 and used to create that part of a binary code consisting of a '1'. A '0' can be made in several ways: 1) by excluding magnetic elements from the regularly spaced array, 2) causing an element to be non-magnetic by thermally diffusing an additional element into the material, 3) crystallizing amorphous magnetic material used for the elements by treating them by using a laser or a high current passed through the element thus causing it to have a very high coercivity. An external head with a ferrite core driven at high frequencies can also be used. These process steps provide the required means for personalizing the array giving rise to unique codes. For 40 elements, as many as 1 trillion unique codes can be established.

Figure 4:
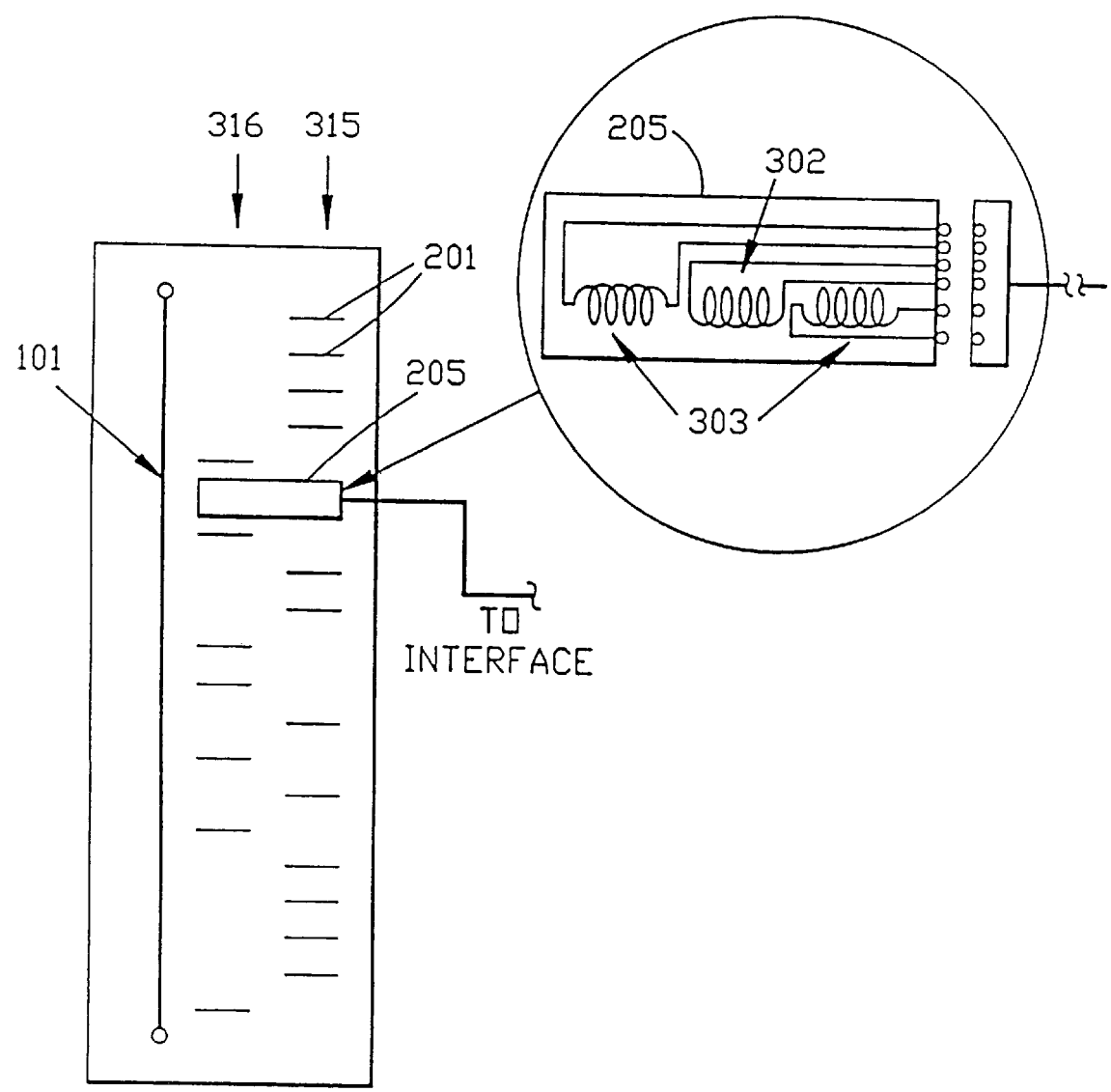
FIG. 4 shows a tag of the invention having a dual row of soft magnetic code elements and the schematic of a single write, dual read head.

A simple code where the '1's and '0's are discernible, irrespective of the scanning speed of head 205, can be obtained by using two parallel complementary rows 315, 316 of elements 301 as shown in FIG. 4. This embodiment requires at least two independent reading elements 303 that can slide over or near the parallel rows, each head reading a separate row. The heads are fixed to one another to sense simultaneously along the same axis normal to the scanning axis. In FIG. 4, for example, the presence of the element in one of the rows (e.g., 315) constitutes a '1' and is accompanied by the absence of an element in the other row 316. The '0' comes about by the presence of an element in one row (e.g, 316) accompanied by the absence of the corresponding element in the other row 315. The tag of FIG. 4 is more precise in providing the '1's and '0's of the code compared to that of FIG. 3. Since hard magnetic elements are not used in the tags of FIGS. 3 and 4, they are immune to tampering by means of strong external magnetic fields.

Figure 5A:
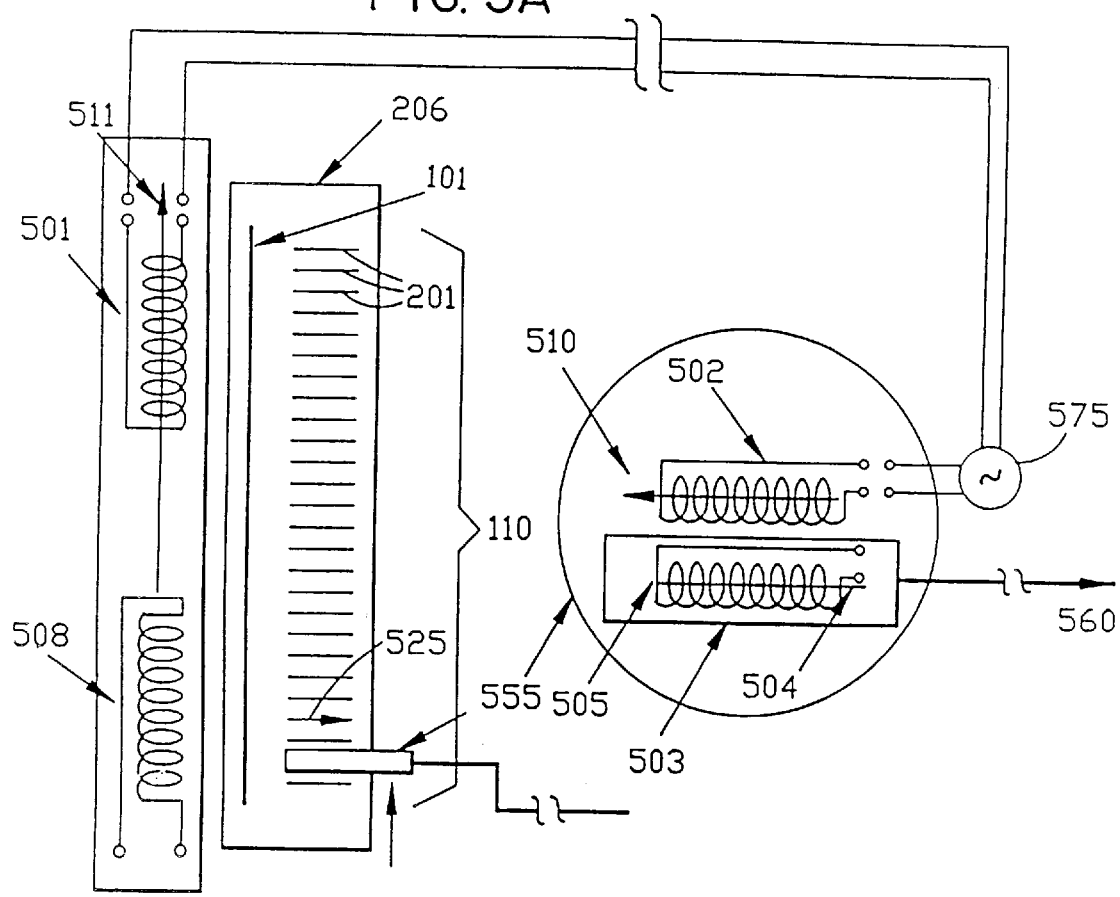
FIG. 5A shows a tag of the invention with an array of hard magnetic elements where the antitheft wire provides a reference signal, read inductively, by a novel head that also has a soft magnetic wire as part of the sensing element.
Figure 5B:
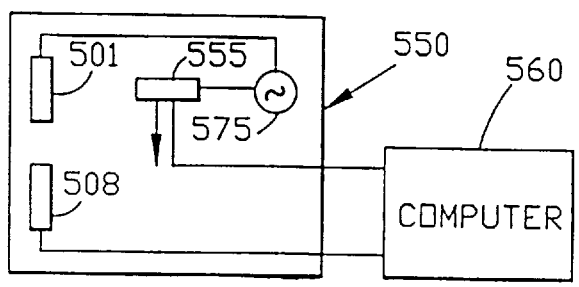
FIG. 5B is a block diagram of the sensing assembly for the tag of FIG. 5A.
Figure 5C:
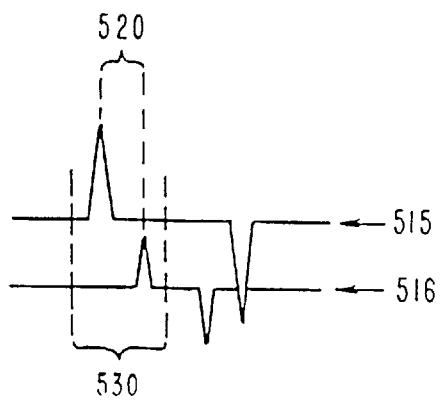
FIG. 5C is a schematic graph of the reference and detected signals from the sensing assembly of FIG. 5B.

Another feature of the present invention includes a set of novel heads that allows a larger than conventional spacing between the head and the magnetic elements as shown in FIG. 5. In that regard, in this description of the invention, reference to core or domain reversal or switching refers to a physical phenomenon well known in the art which results in a magnetic pulse that can be sensed by way of a magnetic pickup coil. Array 110 is sensed by measuring the variation of the phase or position in time at which a soft magnetic element in the reading head switches compared to a reference signal 515. The reference signal 515 is established by the switching of soft magnetic wire 101 which can also serve as an antitheft tag as described in conjunction with FIG. 1. Wire 101 is typically about 5 cm in length or longer in order to be switched by an external magnetic field, denoted by arrow 511, of small magnitude (on the order of 1 gauss) in a direction parallel to the axis of the wire produced by reference excitation coil 501, which is part of read assembly 550 as shown in FIG. 5B. Sensing element 503 also comprises a soft magnetic wire 504 which in one embodiment constitutes the high permeability core of sensing coil 505. The detection is based on the fact that the local ac field (produced by interrogation coil 502) needed to switch sensing wire 504 within coil head 505 is different in magnitude than the field 511 needed to switch the reference wire 101. Since the two excitation coils 501 and 502 are connected electrically to the same ac current source (575) the difference in switching thresholds of wires 101 and 504 results in an initial phase difference of the pulses emanating from the interrogated wire element 504 of sensing element 503 and reference wire 101.

The pulse from reference wire 101 is sensed by separate pickup coil 508 in the reading assembly with the coil in close proximity to wire 101. When a dc bias magnetic field is applied to the soft magnetic pickup element, the phase of the detected signal of the sensing wire changes. When the dc field (shown by arrow 525) is provided by hard magnetic elements 201 constituting the array, the sensing wire 504 next to this element will exhibit a pulse whose phase is further changed with respect to the phase of reference signal 515. An appropriate set of phase differences can be used to generate the code. The magnitude of the bias will determine the phase at which the soft magnetic wire in the head switches and this switching can be measured with respect to the reference signal.

When head 555 is placed in close proximity to one of the hard magnetic elements polarized in 1 of 2 possible directions, the magnitude of the dc bias produces a distinct phase difference 520 between the pulse from reference signal 515 and the pulse from signal 516 arising from sensing wire 504. If this phase difference falls within a predetermined temporal window 530 it can be arbitrarily ascribed as a '1' or a '0'. Alternatively, when head 505 moves away from a position in which a magnetic element is located, the bias acting on the head changes. If the new location to which the head has moved does not have a magnetic element, the smaller local bias field will cause switching of sensing wire 504 to occur with a different phase, outside of the pre-determined temporal window 530 and the bit takes the complementary value of the one assigned above. A computer 560 can track the phase at which switching occurs and therefore assign 1's and 0's.

Alternatively, in a less preferred embodiment (because head 555 must be closer to the tag than in the preceding example), the code can be provided by soft magnetic elements 301. Here, the phase of the signal 516 will reflect the effect of the presence or absence of element 301 on the local ac field produced by the interrogation coil 502 as described in conjunction with FIG. 3.

Figure 6A:
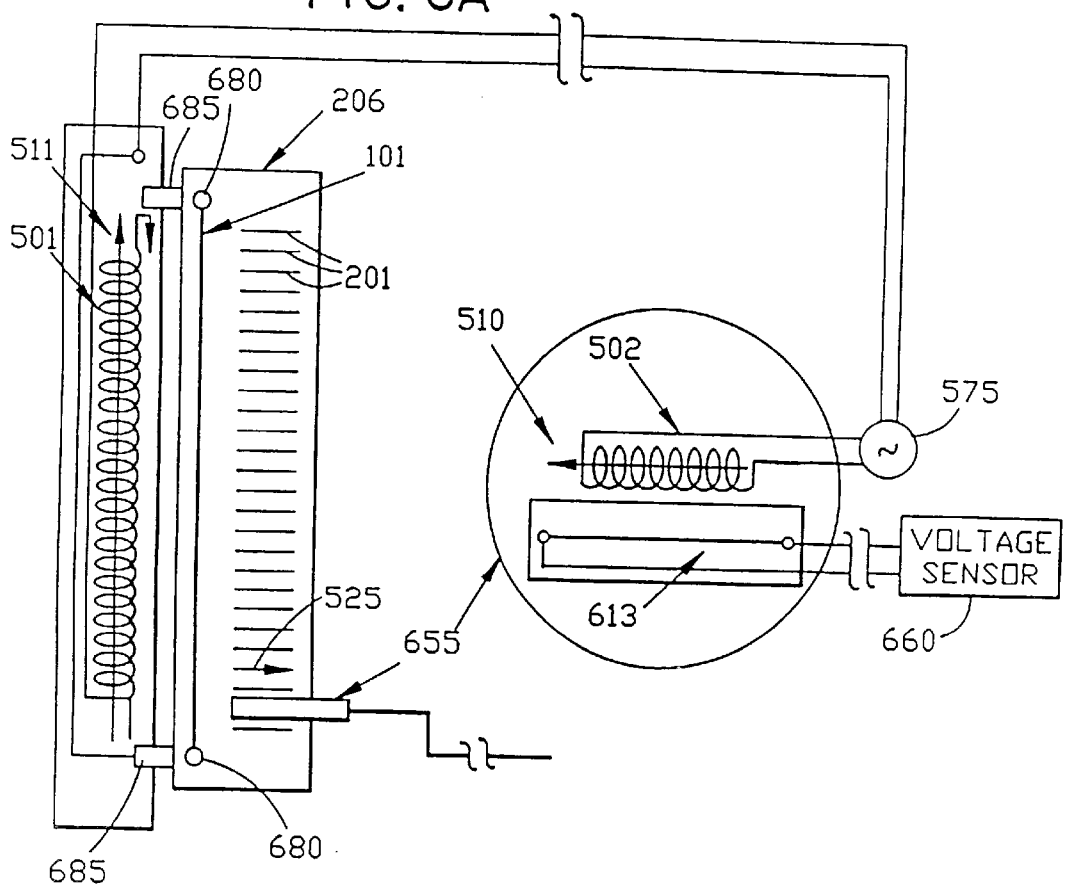
FIG. 6 shows a tag as in FIG. 5A, where the antitheft wire provides a reference signal in the form of voltage pulses measured by direct electrical contact, together with a reading head where the sensing element also provides a set of voltage pulses measured by direct electrical contact.
FIG. 6B is a block diagram of the sensing assembly for the tag of FIG. 6A.
FIG. 6C is a schematic graph of the reference and detected signals from the sensing assembly of FIG. 6B.

In another embodiment shown in FIG. 6A, B, and C, sensing coils 505 and 508 in sensing assembly 550 of FIG. 5 are absent and the Matteucci effect is utilized. The Matteucci effect is characterized by voltage pulses induced along the length of a soft magnetic wire or material by the application of a magnetic field applied either along the longitudinal or perpendicular direction with respect to the long axis of the magnetic wire. The longitudinal Matteucci effect is more pronounced at low frequencies while the perpendicular Matteucci effect is more prominent at higher frequencies, typically above 1 kHz. The perpendicular effect often utilizes the passage of a dc or ac current through the wire exhibiting the voltage. Reference to the Matteucci effect refers to the voltage measured between two portions of the reference and/or sensing wires. The Matteucci effect is described in more detail in Mechanism of Matteucci Effect Using Amorphous Magnetic Wires by K. Kawashima, et al., IEEE Trans. Jnl. on Magnets in Japan, V8, No. 5, May 1993, which is incorporated herein by reference.

Figure 6B:
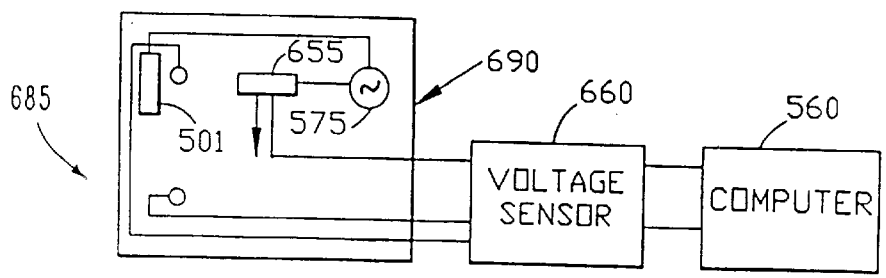

In this embodiment, the sensing element in sensing assembly 690 consists of a soft magnetic material exhibiting the Matteucci effect. Two separate longitudinal Matteucci voltages are utilized. One to sense reference field 511 to establish reference signal 615, and the other to sense the bit elements 201. The field inducing the Matteucci voltage in element 613 is provided by interrogation coil 502 and the bit element. A field 510 is generated within the head structure using a current driven coil 502 arranged to have preferably a parallel field direction with respect to the axial direction of sensing wire 613. In FIG. 6A the Matteucci voltage from wire 101 is sensed at contact points 680 by establishing a suitable connection with voltage sensor 660 through contacts 685 as shown in FIG. 6B.

Figure 6C:
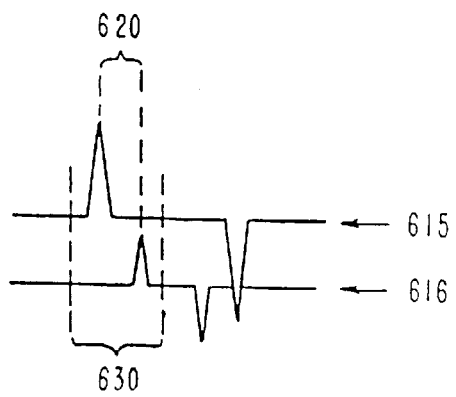

Additional embodiments can be obtained by interchanging the means of generating the reference signal and the means for sensing the code of FIGS. 5 and 6. For instance, by choosing to sense the reference signal inductively as in FIG. 5 and sense the signal from the array by a Matteucci voltage as in FIG. 6 or vice versa.

Figure 7A:
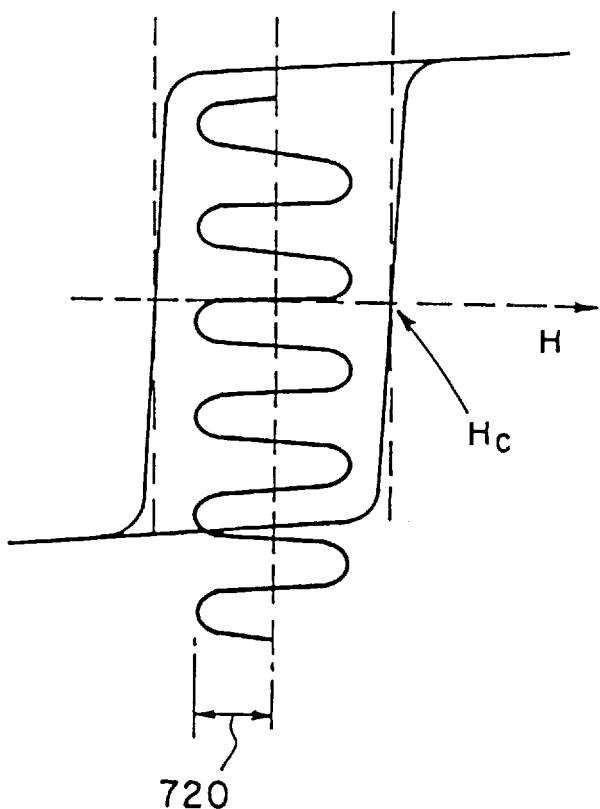
FIG. 7A shows a hysteresis loop of soft magnetic wire together with ac field having a magnitude less than the coercive field (Hc) of the wire.
Figure 7B:
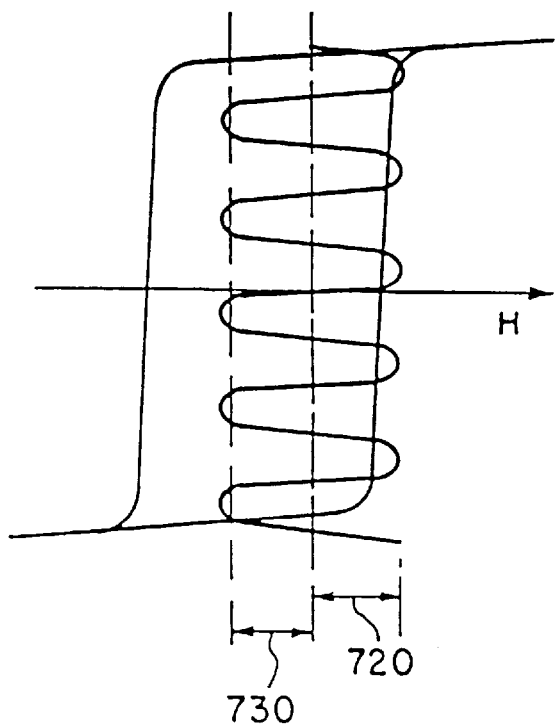
FIG. 7B shows the loop and field of FIG. 7A with an applied bias sufficient to magnetize the wire in one direction.
Figure 7C:
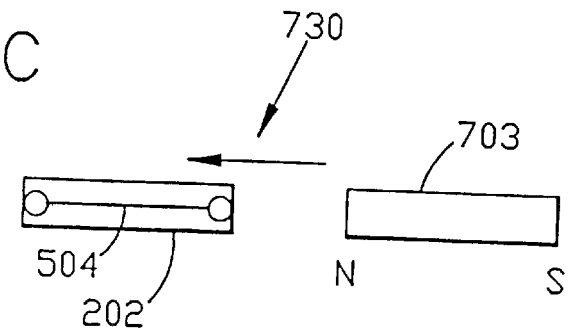
FIG. 7C shows hard magnet means for providing the bias field of FIG. 7B.

Another method for establishing a code using the switching properties and/or the longitudinal Matteucci effect of soft magnetic wires 101 and 504 (or 613 in this discussion) is to set the magnitude of the ac magnetic field 510 that excites sensing wire 504 in the head below the corresponding value that switches wire 504 and to set the magnitude of reference field 511 above the switching threshold of wire 101. Under these conditions, the reference wire is switched with each polarity reversal of the ac field while the sensing wire is not switched and signal 516 (or 616) is absent. FIG. 7A shows a hysteresis loop for wire 504 together with an ac applied magnetic field 510 whose amplitude 720 is insufficient to switch wire 504. Upon addition of a dc bias field 730 shown in FIG. 7B, wire 504 will switch at most once and remain pinned. In that case there will be no repetitive ac signal 616 detected in the head 555. Such a bias field can be produced by an element 703 of array 110 as shown in FIG. 7C. This failure to switch continuously with the ac field can be used to constitute a '0' in the code. Alternatively, the '0' may be formed by leaving elements 703 out of array 110.

Figure 7D:
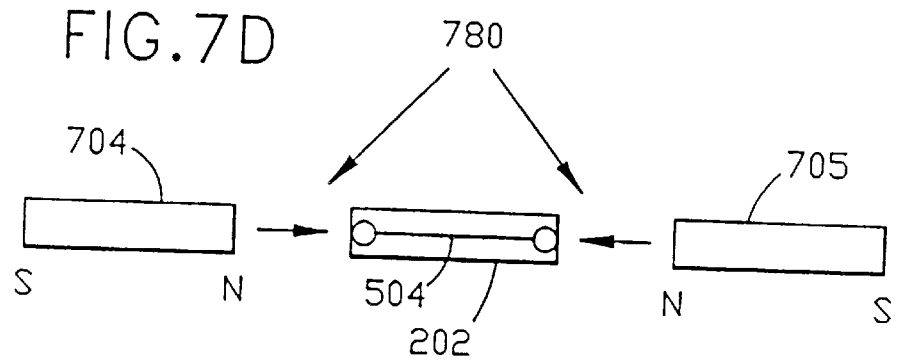
FIG. 7D shows hard magnet means for biasing the soft magnetic wire so that it switches with each half cycle of the ac field.

In order to achieve repetitive switching of wire 504 for signal averaging purposes, a field 780 provided by elements 704 and 705 in FIG. 7D is used. The bias 780 has a configuration such that the two ends of the sensing wire 504 contained in head 555 are subjected to dc biases of opposite polarity. The ac interrogation field 720 is capable of causing nucleation of a magnetic domain which propagates along the wire 504 to cause a change of flux in the sensing coil 505 of the head. This nucleation and propagation process with the bias of FIG. 7D is repeated on the opposite end of wire 504 on the other half of the ac cycle of magnetic field 510. This ac switching yields a signal 516 (or 616) that can be used to create '1' in the code.

Figure 7E:
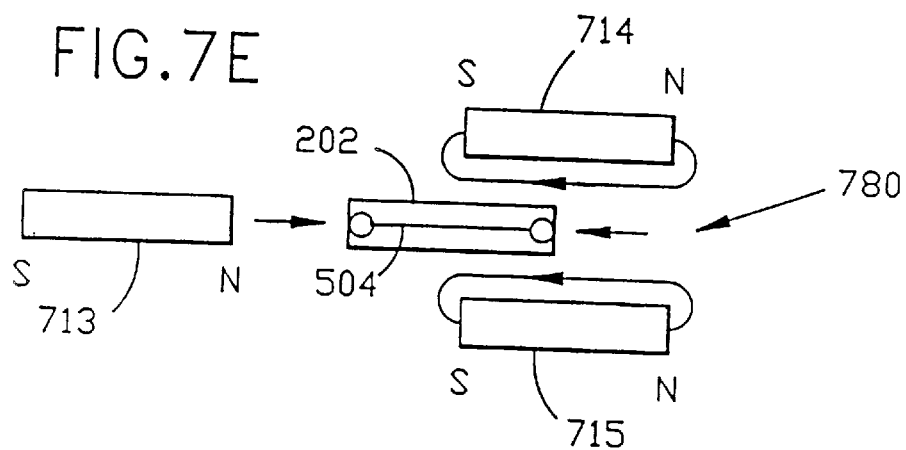
FIG. 7E shows an alternative configuration to that of FIG. 7D.
Figure 7F:
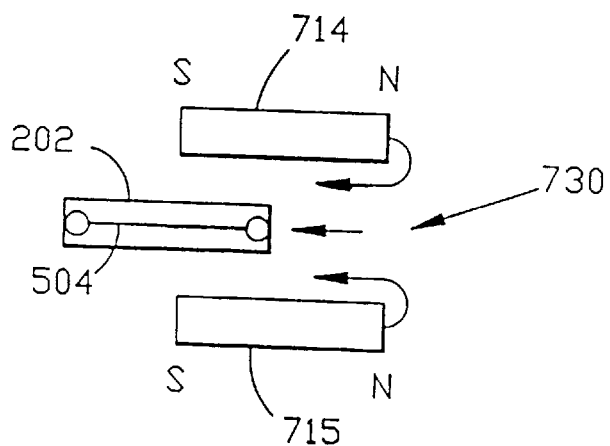
FIG. 7F shows an alternative configuration to that of FIG. 7C.

The field 780 required to switch wire 504 can be produced by other bias element configurations. FIG. 7E, for example, shows the hard magnetic elements 713, 714 and 715 that produce the required field 780. The absence of 713, as in FIG. 7F, will cause pinning of element 504 and the absence of signal 516 (or 616).

In yet another embodiment, the transverse Matteucci effect is utilized in one of several ways. This transverse effect is based on having circumferential magnetic domains in Matteucci wire 101 which may be oriented preferably by an ac or do current passing through the soft magnetic wire. Applying a local ac magnetic field perpendicular to wire 101 affects the circumferential flux and gives rise to ac changes in the voltage along the length of wire 101. The amplitude of the voltage pulse (850) is directly proportional to the amplitude of the perpendicularly applied local magnetic field 811. Therefore, a code can be constructed by varying the magnitude of the transverse, i.e., perpendicularly applied magnetic field 811 for varying positions along wire 101 so that the voltage pulse measured at its end contacts 880 varies. To achieve a voltage variation of pulse 850, two types of reluctance can be defined. For a given fixed value of perpendicularly applied magnetic field 811, applied by coil 802 in FIG. 8, a low reluctance path 821 between wire 101 and magnetic excitation coil 802 gives rise to a larger magnitude of the local field and consequently to a relatively strong voltage pulse 810, shown in FIG. 8B.

Figure 8A:
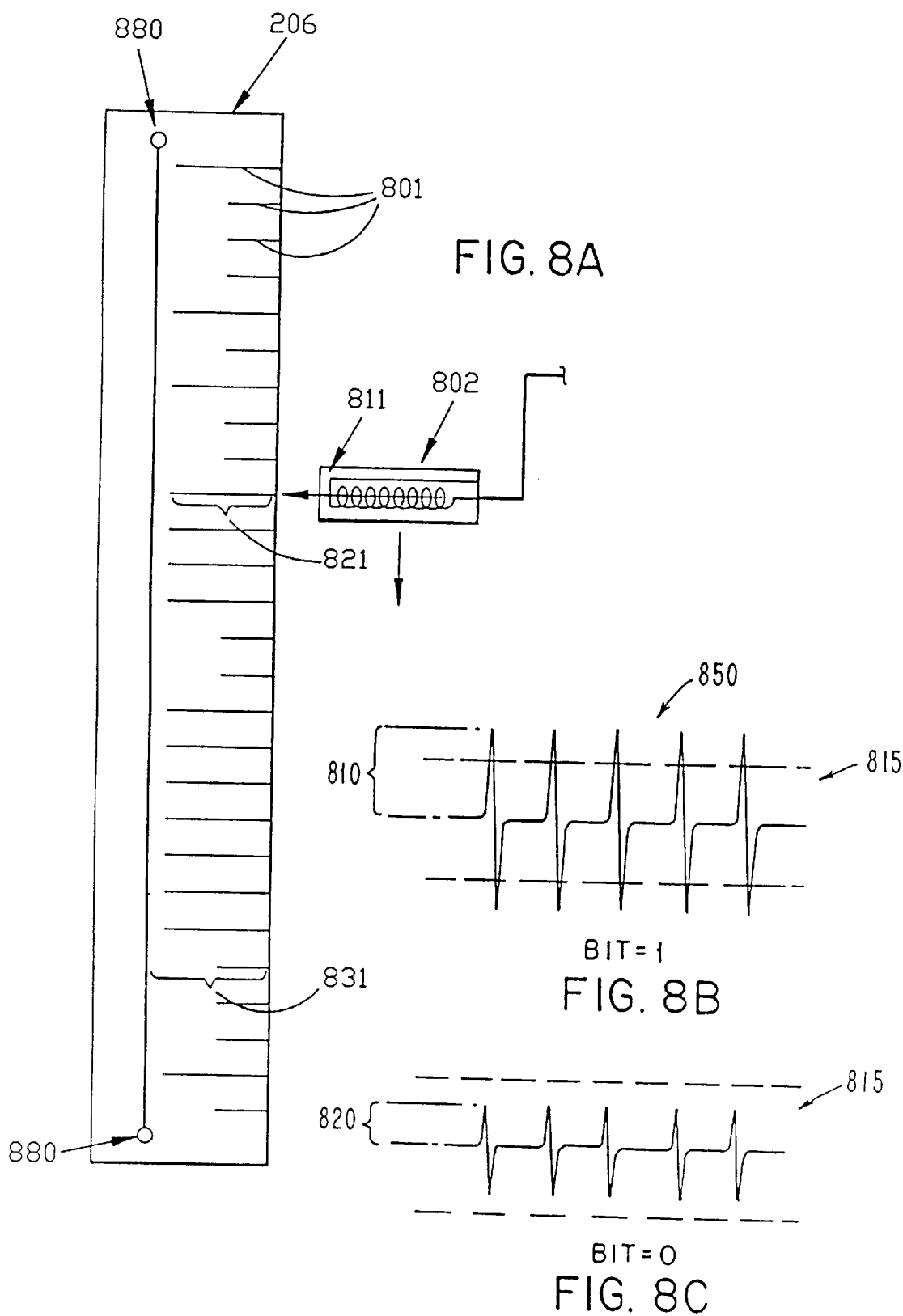
FIG. 8A shows the configuration of a tag of the invention utilizing the perpendicular Matteucci effect to obtain coded information from a soft magnetic wire and perpendicular magnetic elements in close proximity with the wire.

On the other hand, a high reluctance path 831 results in a smaller voltage pulse 820 below threshold 815, also shown in FIG. 8C. Thus, a code of '1's and '0's is produced by varying the reluctance path in a predetermined distinct pattern. This variation is achieved by placing soft magnetic elements 801 having different lengths or magnetic saturation values in proximity to Matteucci wire 101. Another means for varying the reluctance is to have magnetic elements present for low reluctance, absent for high reluctance as in FIG. 3 to establish a code of '1's and '0's respectively. When a dc current is passed through the Matteucci wire, the pulse due to the perpendicular field excitation has a frequency equal to twice that of the excitation field. When an ac element with frequency $f_0$ current is passed through the wire, and the perpendicular field is applied at a different frequency $f_1$ (preferably lower), the resulting Matteucci voltage in the wire becomes modulated. FIG. 9 shows how this modulation, depicted in FIG. 9B, is sensed by an amplitude demodulation system 925, well known to those skilled in the art. In this mode, the code can be sensed by a computer in terms of the varying depth of modulation, deep modulation corresponding to a '1', low to a '0'.

Figure 10:
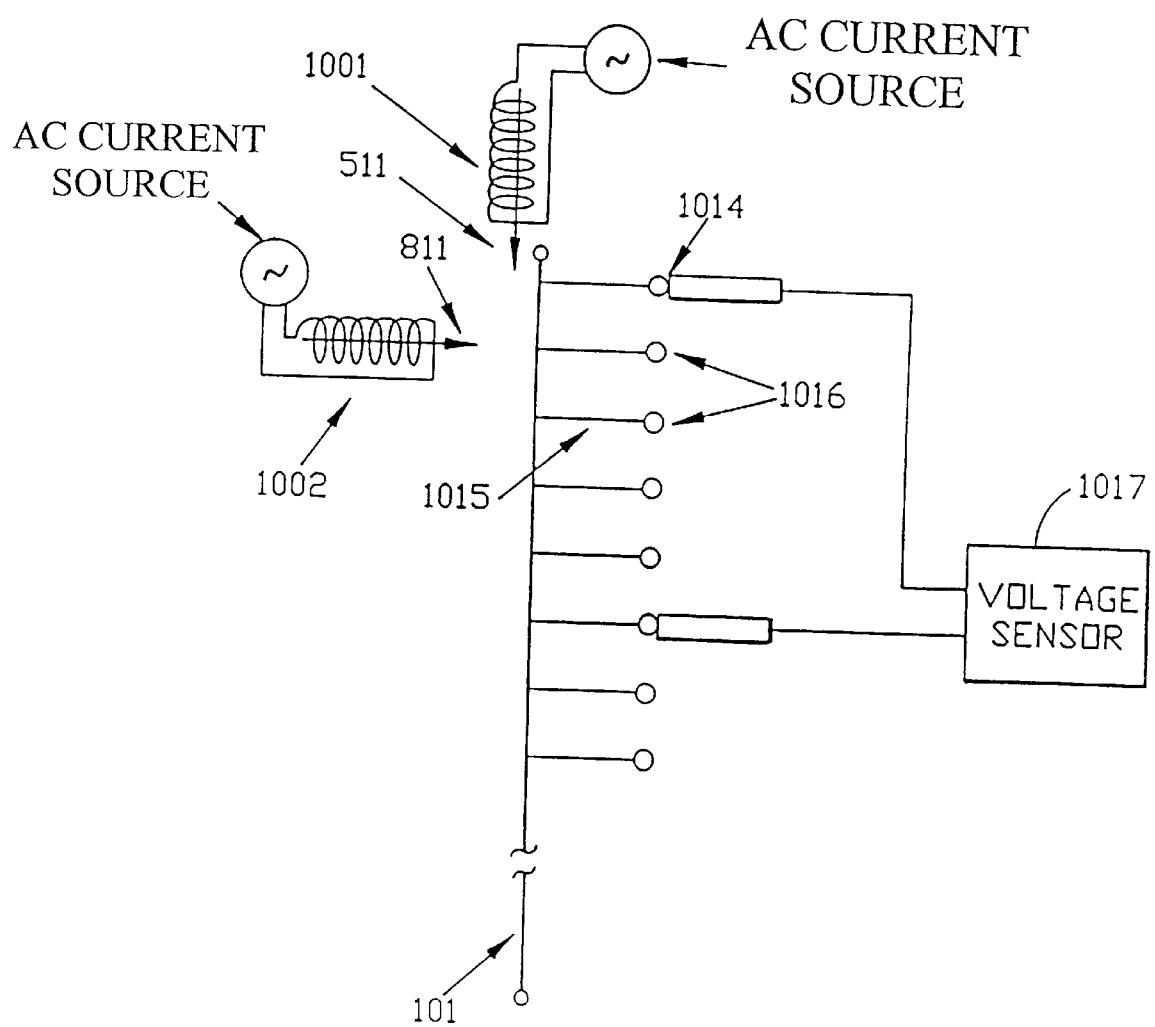
FIG. 10 shows the configuration of a tag of the invention wherein the code is provided by measuring the Matteucci voltage along different portions of the wire.

FIG. 10 shows another means for establishing a code by measuring the Matteucci effect along different portions of reference wire 101. Reference wire 101 is electrically contacted along different segments of its length by electrically conducting paths 1015 which connect to a set of test points 1016. When a fixed excitation coil 1001 or 1002 applies an ac magnetic field in a direction either perpendicular (811) or longitudinal (511) to wire 101, the voltage between a test point at the end of the wire 1014 and a contact point 1060 is measured by a voltage sensor 1017. The code is established by the presence or absence of the conducting path 1015.

Personalization of the elements used for measuring the Matteucci voltage by direct electrical contact methods can be achieved by interrupting the electrical pathway between the Matteucci wire and the code conducting path 1015. In one embodiment conducting path 1015 can be fabricated or printed with a conductive ink with local constriction. Personalization is then achieved by opening the conducting path 1015 by passing short pulsed current of sufficient magnitude between one end of the Matteucci wire 1014 and the corresponding contact point 1016 of the array. Alternatively, the conducting path 1015 can be opened by means of direct heating by a laser or through the use of local RF heating.

Alternatively, conducting path 1015 can incorporate a small nonconducting gap of carbonaceous material that can be made conducting selectively by dielectric breakdown and Joule heating, methods well known to those skilled in the art, thereby creating a continuous conducting path. Also, alternatively, a code can be established by a structure such as that of FIG. 10 wherein wire 101 is any electrical conductor and the code is established by whether an electrical path exists or does not exist between points 1014 and points 1016.

There are various ways for interrogating the bit arrays described above. For instance, the head can have a single ac magnetic coil and sensor that slides at a uniform speed to interrogate the different elements of the code. Here the head can be spring loaded to achieve a constant scan velocity although in general this is not necessary since initial bits can be used to establish a clock. Alternatively, to scan the elements a time reference, $t_1$ can be generated by a computer and the sequence tracked by the same computer.

Figure 11A:
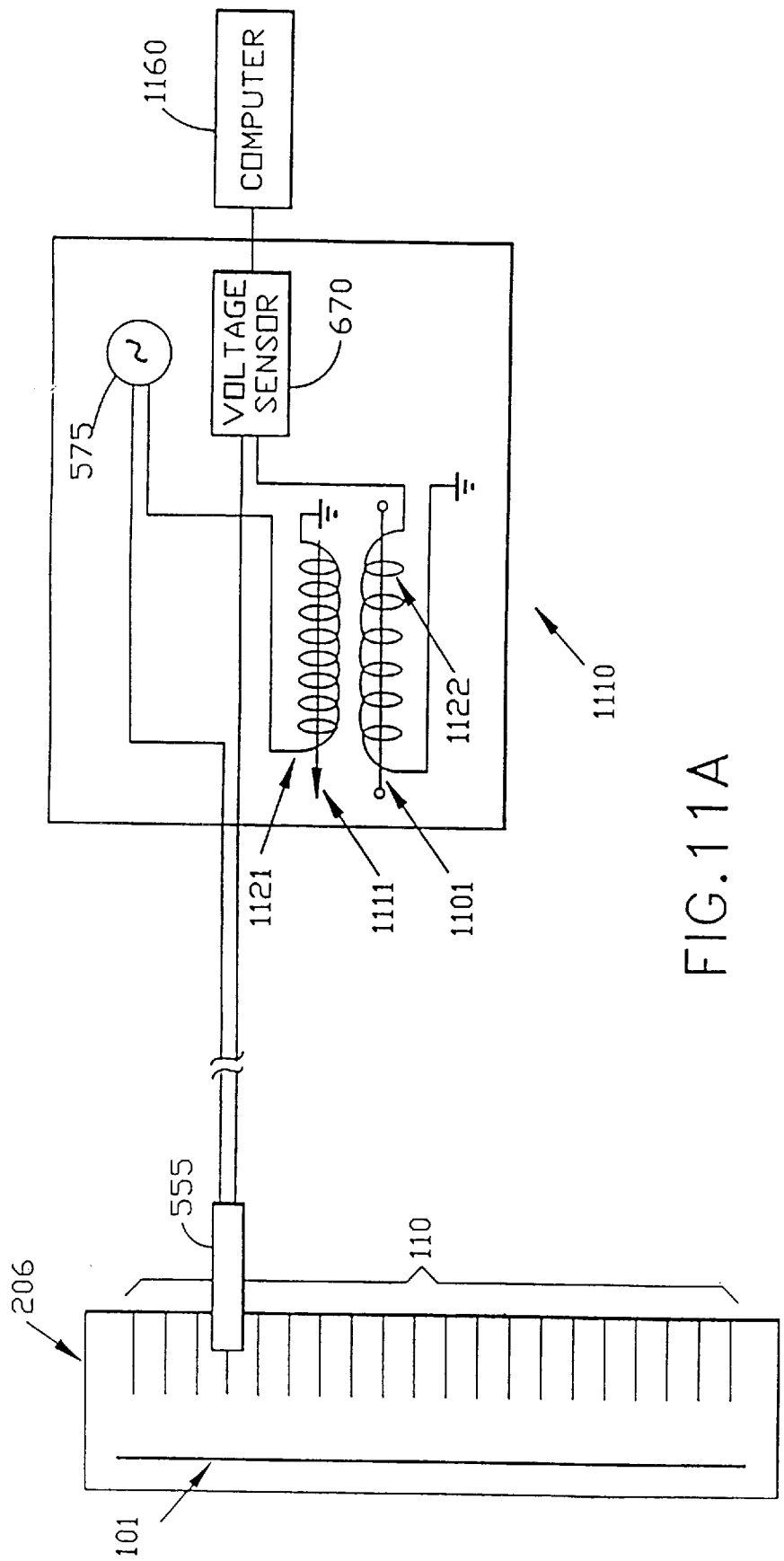
FIG. 11A shows a tag embodiment as in FIG. 5A but wherein the reference element is placed within the reading assembly.
Figure 11B:
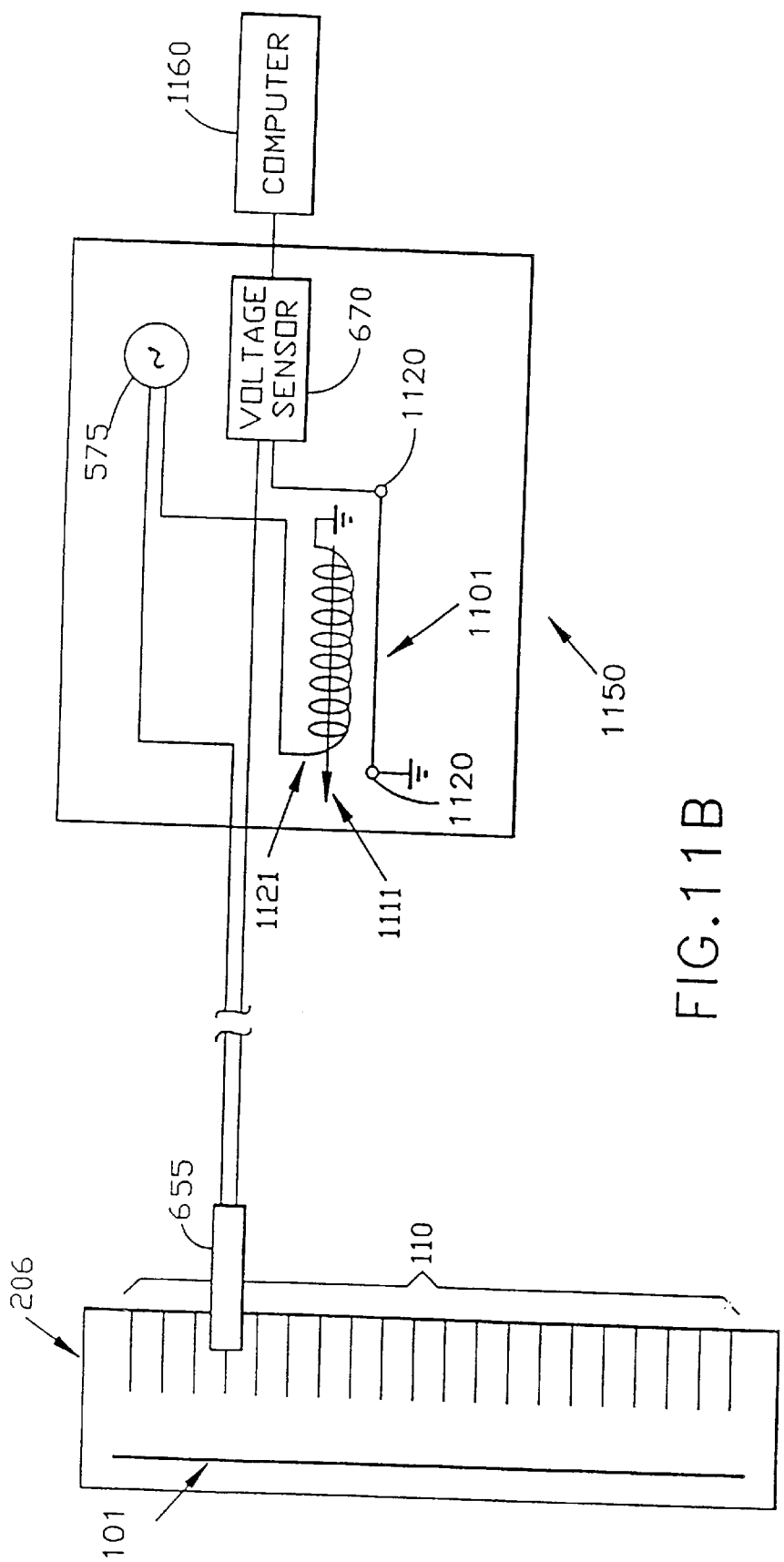
FIG. 11 B shows a tag embodiment as in 6A but wherein the reference element is placed within the reading assembly.

For those cases where reading of the code requires a reference signal as described in the embodiments shown in FIGS. 5 or 6, a reference wire 1101 can be part of the sensing apparatus 1110 (or 1150), which is excited by ac field 1111, produced by coil 1121 conveniently located within apparatus 1110. There are two ways of obtaining the reference signal from reference wire 1101. One way, the embodiment of FIG. 11A (akin to the embodiment of FIG. 5A), utilizes the abrupt switching of wire 1101 with applied magnetic field from 1121 yielding a sharp pulsed magnetic field radiating from wire 1101 that can be inductively sensed with pickup coil 1122 mounted in its proximity. A second embodiment of FIG. 11 B, (akin to the embodiment of FIG. 6A) utilizes the Matteucci effect of wire 1101, with applied magnetic field from coil 1121, sensed directly by a voltage sensor connected to electrical contacts 1120, at each end of Matteucci wire 1101. In either case, the signals are transmitted from a voltage sensor, e.g., 670, to computer 1160 to compare the phase of the reference signal relative the signals measured from the bit array. Again, head 555 in FIG. 11 may be used with the sensing apparatus 1150 and head 655 in FIG. 11 B may be used with the sensing apparatus 1110 of FIG. 11A.

In another embodiment, a multiplicity of head elements 205 comprising individual excitation coils and sensing elements can be used where the multiplicity is such that a sensing element is assigned to each possible element site. In this embodiment, no mechanical scanning is utilized, rather each element 205 is sequentially activated to excite and sense the element of the array, thereby obtaining the code.

It is well known to those skilled in the art that the information gathered by the scanning heads described herein can be transmitted to remote locations using RF data communication or RF tag technology. Furthermore, the information from the scanning heads can be transformed for replication by a bar code label printer.

While the invention has been described in terms of preferred and alternative embodiments, those skilled in the art will recognize that the invention can be practiced with modification within the spirit and scope of the appended claims.

Having thus described our invention, what we claim as new and desire to secure by Letters Patent is as follows:

1. A tag for concealing in an object for providing antitheft protection and identification codes comprising:
an antitheft element, and magnetically unbiased means for providing an identification code.

2. The tag of claim 1 wherein said antitheft element is an amorphous wire and said means for providing an identification code comprise a plurality of hard magnetic elements.

3. The tag of claim 2 wherein a zero is formed by having the local magnetization of an element oriented in one direction and a one is formed by having the local magnetization of an element oriented in the opposite direction.

4. The tag of claim 2 wherein a zero is formed by the absence of hard magnetic elements in an otherwise periodic array of hard magnetic elements.

5. The tag of claim 1 wherein said antitheft element is an amorphous wire and said means for providing an identification code comprise a plurality of low remanence soft magnetic elements.

6. The tag of claim 5 wherein a code is established by the presence or absence of soft low remanence magnetic elements in an otherwise periodic array of said soft magnetic elements.

7. The tag of claim 1 wherein said antitheft element is an amorphous wire and said means for providing an identification code comprises first and second parallel arrays of low remanence soft magnetic elements wherein said code is established by the presence or absence of said soft magnetic elements in an otherwise periodic array of said soft magnetic elements in each of said first and second parallel arrays and wherein the presence of a low remanence soft magnetic element in said first array is associated with the absence of a low remanence soft magnetic element in said second array and the absence of a low remanence soft magnetic element in said first array is associated with the presence of a low remanence soft magnetic element in said second array.

8. A method for protecting an object from theft and for identifying said object comprising the steps of:
   a) concealing an identification tag in said object, said tag comprising an antitheft element in the form of an amorphous wire and magnetically unbiased means for providing an identification code wherein said code comprises a plurality of low remanence soft magnetic elements;
   b) providing a sensing head wherein said head consists of an excitation coil and a sensing coil; and
   c) interrogating said tag by moving said head along said tag to thereby induce a magnetic field in said low remanence soft magnetic elements, if present, with the excitation coil while sensing the magnetization of said low remanence soft magnetic elements with the sensing coil.

9. A system for protecting an object from theft and for identifying said object comprising:
   an antitheft element;
   magnetically unbiased means for providing an identification code; and
   means for reading said code.

10. A system as in claim 9 wherein said means for reading said code comprises:
   a scannable head wherein said head has an excitation coil and a sensing coil, said sensing coil being linearly disposed about the long axis of a soft magnetic wire; and
   a reference signal generator.

11. A system as in claim 9 wherein said means for reading said code comprises:
   a scannable head wherein said head has an excitation coil and a sensing element, said sensing element being a soft magnetic wire which exhibits the Matteucci effect; and
   a reference signal generator.

12. The system of claim 10 wherein said reference signal generator comprises excitation and sensing coils, said sensing coil being linearly disposed about the long axis of a soft magnetic wire.

13. The system of claim 11 wherein said reference signal generator comprises a coil for exciting a soft magnetic wire said soft magnetic wire, wherein exhibits the Matteucci effect.

14. The system of claim 10 wherein said reference signal generator comprises a coil for exciting a soft magnetic wire, wherein said soft magnetic wire exhibits the Matteucci effect.

15. The system of claim 11 wherein said reference signal generator comprises excitation and sensing coils, said sensing coil being linearly disposed about the long axis of a soft magnetic wire.

* * * * *